United States Patent [19]

Miller et al.

[11] Patent Number: 4,677,340

[45] Date of Patent: Jun. 30, 1987

[54] METHOD AND APPARATUS FOR CALIBRATING DEFLECTION IN AN OSCILLOSCOPE

[75] Inventors: Lawrence J. Miller, Hillsboro; Donald P. Chitwood, Portland, both of Oreg.

[73] Assignee: Tektronix, Inc., Beaverton, Oreg.

[21] Appl. No.: 685,879

[22] Filed: Dec. 24, 1984

[51] Int. Cl.⁴ .................................. H01J 31/26
[52] U.S. Cl. .................................. 315/10; 358/69; 324/404
[58] Field of Search ............... 315/10; 358/10, 69, 358/139, 163; 328/188, 189; 324/404

[56] References Cited

U.S. PATENT DOCUMENTS 4,021,724  5/1977  Rawcliffe et al. .............. 324/404
4,099,092  7/1978  Bristow .......................... 315/10
4,439,735  3/1984  Alvite et al. .................... 358/10

FOREIGN PATENT DOCUMENTS 960997  9/1982  U.S.S.R. ........................ 324/404

Primary Examiner—Theodore M. Blum
Attorney, Agent, or Firm—John P. Dellett; George T. Noe; Mark L. Becker

[57] ABSTRACT

The cathode-ray-tube beam deflection of an oscilloscope is automatically calibrated by photoelectrically detecting the intersection of the tube's electron beam with visible graticule lines on the tube's faceplate. An input signal is compared, at the time of intersection, with stored values representative of the graticule lines, and the deflection amplifier gain of the oscilloscope is adjusted until the graticule lines properly represent the measurement of the input signal.

8 Claims, 10 Drawing Figures

METHOD AND APPARATUS FOR CALIBRATING DEFLECTION IN AN OSCILLOSCOPE

BACKGROUND OF THE INVENTION

The present invention relates to calibration of oscilloscope deflection and particularly to automatic calibration accomplished without utilizing a specialized cathode-ray-tube or requiring manual adjustment.

Since an oscilloscope is usually employed as an accurate measuring instrument, the accurate calibration thereof is essential. One calibration consideration relates to the accuracy of the deflection of the electron beam in the oscilloscope's cathode-ray-tube so that the amplitude (Y deflection) and duration (X deflection) of a tested waveform are accurately portrayed. Heretofore, it has been the practice to employ a calibrated standard as a deflection waveform input for the oscilloscope, and then adjust the deflection factor or amplification of the oscilloscope circuitry so that a predetermined deflection is achieved. For instance, a common requirement in oscilloscope specifications is that a 50 millivolt increment in input signal be required to move the cathode-ray-tube's electron beam between graticule divisions on the tube's faceplate. Not only is down time consumed for the periodic calibration of the oscilloscope, but also some skill on the part of maintenance personnel is necessary for proper adjustment.

It is possible to adjust the positioning of a cathode-ray-tube's electron beam automatically so that its location can be predetermined. For example, beam indexing cathode-ray-tubes employed for color television applications can accurately locate the tube's electron beam so as to register properly with the separate color emitting phosphors of the primary colors. U.S. Pat. Nos. 4,247,869; 2,778,971 and 2,790,107 and British patent No. 822,017 illustrate cathode-ray-tubes employing indexing elements, strips or bands supplying feedback indicative of the electron beam's actual position. The indexing elements produce a light emission or electron emission when crossed by the electron beam and this emission is detected within the tube in order to position the beam. Unfortunately, the manufacture of such tubes requires sophisticated and complex screening techniques.

SUMMARY OF THE INVENTION

In accordance with the present invention, in a particular embodiment thereof, an oscilloscope including a cathode-ray-tube having a light visible graticule is calibrated through detection of the intersection of the cathode ray tube's electron beam with the tube's graticule. In response to detection of this intersection, a comparison is made between the signal causing the deflection and a standard deflection value represented by the graticule, and an adjustment is automatically made in deflection until the electron beam trace produces an intersection correctly representative of the signal. Thus, the already present graticule associated with the oscilloscope is employed for automatically calibrating the oscilloscope.

In a particular embodiment, photoelectric means are positioned proximate an edge of the cathode-ray-tube's faceplate for detecting the intersection of the electron beam with the graticule. Light scattered by the graticule at the time of intersection causes the photoelectric means to produce an output which, through comparison, is utilized to adjust the gain of the oscilloscope's deflection amplifier until the graticule intersection presents a true representation of the input signal.

It is accordingly an object of the present invention to provide an improved method and apparatus for calibrating the deflection of an oscilloscope, which method and apparatus do not require down time nor adjustment of the oscilloscope by skilled personnel.

It is another object of the present invention to provide an improved method and apparatus for calibrating the deflection of an oscilloscope without requiring specialized indexing means associated with the oscilloscope's cathode-ray-tube.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is an explanatory, cut-away view of an oscilloscope's cathode-ray-tube illustrating the method and apparatus for calibrating oscilloscope deflection in accordance with the present invention, FIG. 2 is a cross-section of a cathode-ray-tube faceplate constructed in accordance with the present invention, FIG. 3 is a waveform diagram depicting light intensity output at the faceplate edge of the aforementioned cathode-ray-tube relative to beam deflection position, FIG. 4 is a block diagram of circuitry utilized in calibrating cathode-ray-tube deflection, FIG. 5 depicts a reference record, as stored in memory in the FIG. 4 circuitry, as compared with a new record generated by the light intensity output shown in FIG. 3, FIG. 6 illustrates the same comparison as in FIG. 5, but with offset removed, FIG. 7 depicts the resultant of division of the aforementioned reference record by the new record as utilized for controlling the deflection of the cathode-ray-tube's electron beam in accordance with the present invention, and FIGS. 8, 9 and 10 are flow charts illustrating operation of the microprocessor in the FIG. 4 circuit.

DETAILED DESCRIPTION

Figure 1:
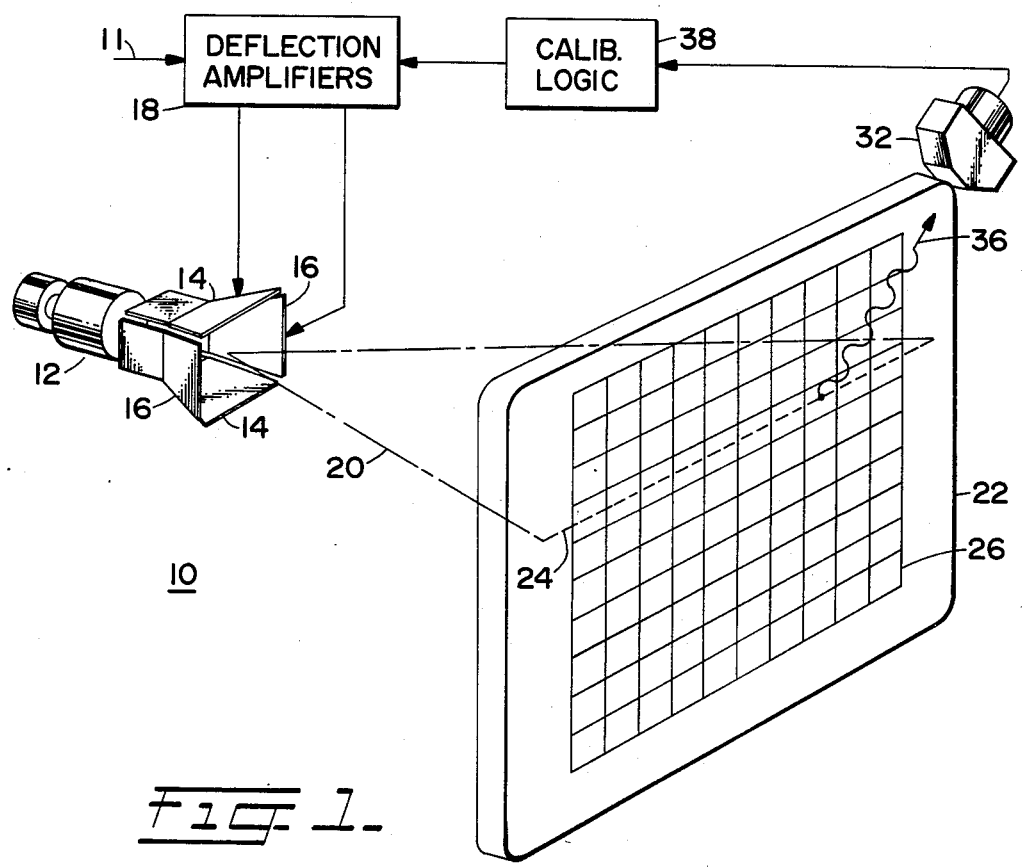

Referring to the drawings and particularly to FIG. 1, a cathode-ray-tube 10 according to the present invention includes an electron gun 12, vertical deflection plates 14, and horizontal deflection plates 16. Signals produced by deflection amplifiers 18 and applied to the respective sets of deflection plates typically cause the tube's electron beam 20 to sweep across the tube's faceplate 22 producing a scan 24 in intersecting relation with the tube's graticule or graticule scale 26.

Figure 2:
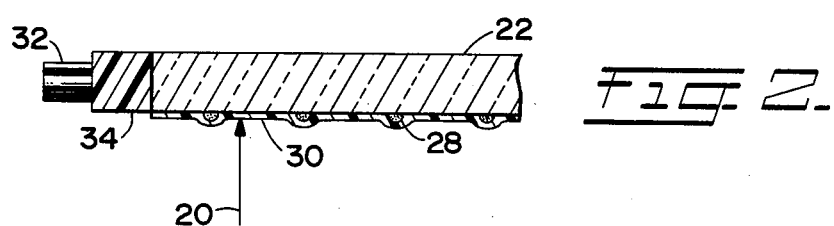

The graticule scale is suitably provided on the inner surface of the faceplate 22 (i.e. the surface toward the electron gun 12) by printing lines of glass frit thereon and fusing such frit lines on to the faceplate to form a white translucent graticule before the layer of phosphor material forming a fluorescent screen is applied to the inner surface of the faceplate over the graticule. A graticule scale of this type is disclosed in Wilbanks et al, U.S. Pat. No. 3,207,936 and is further disclosed in FIG. 2 wherein the glass frit lines 28 are shown covered by phosphor 30. Providing the graticule on the inside of the faceplate in this manner substantially eliminates paralax between the information "written" by the electron beam 20 on the phosphor screen and the graticule utilized to measure the same. The graticule is suitably illuminated by edge lighting (not shown) employing lamp bulbs at the edge of faceplate 22 which can be energized, de-energized or varied in degree of lighting.

Figure 3:
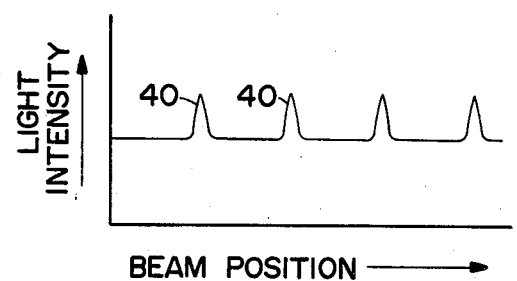

In accordance with the present invention, the graticule is employed in calibrating the deflection of the cathode ray tube's electron beam. A photoelectric means, for example, a photoelectric cell or phototransistor 32, is located adjacent the edge of the cathode-ray-tube's faceplate 22 and is preferably adjacent or located in a notch within light guide member 34 of transparent glass or plastic material adjoining and surrounding faceplate member 22 in the manner illustrated in FIG. 2. Light 36 from the phosphorescence of the screen material, as the electron beam strikes the same, is received by photoelectric means 32 and transformed into an electrical signal supplied to calibration logic circuitry 38. In particular, when the electron beam 20 traces across the graticule lines and intersects one of the lines such as a frit line 28, the light generated by the phosphor immediately around the frit line 28 is scattered sideways through the faceplate and reaches photoelectric means 32. Consequently, as the electron beam 20 is deflected across the faceplate, a light intensity output is delivered to the photoelectric means of the type illustrated in FIG. 3 comprising a plurality of pulses 40, one for each intersection of the electron beam with one of the frit lines 28. This light intensity variation is transformed into an electrical signal variation delivered to the calibration logic. As a result thereof, the calibration logic circuitry adjusts the gain of deflection amplifiers 18 whereby the deflection of the electron beam, for a given input signal, will accurately depict the magnitude of that input signal. For instance, if the deflection between graticule lines is predetermined to depict a 50 millivolt difference, then the gain of the horizontal deflection amplifier in the illustrated example is adjusted so that a change of 50 millivolts in the input signal provided at 11 will move the electron beam the distance between crossings of graticule lines.

A number of different systems can be employed for bringing about the change in deflection amplifier gain. For example, the calibration logic 38 may comprise means for comparing the frequency of the pulse output produced by photoelectric means 32 with a predetermined standard, when the beam is deflected at a predetermined rate. If the pulses are too high in frequency (too close together) or too low in frequency (too far apart) the gain of the deflection amplifier is adjusted accordingly.

Figure 4:
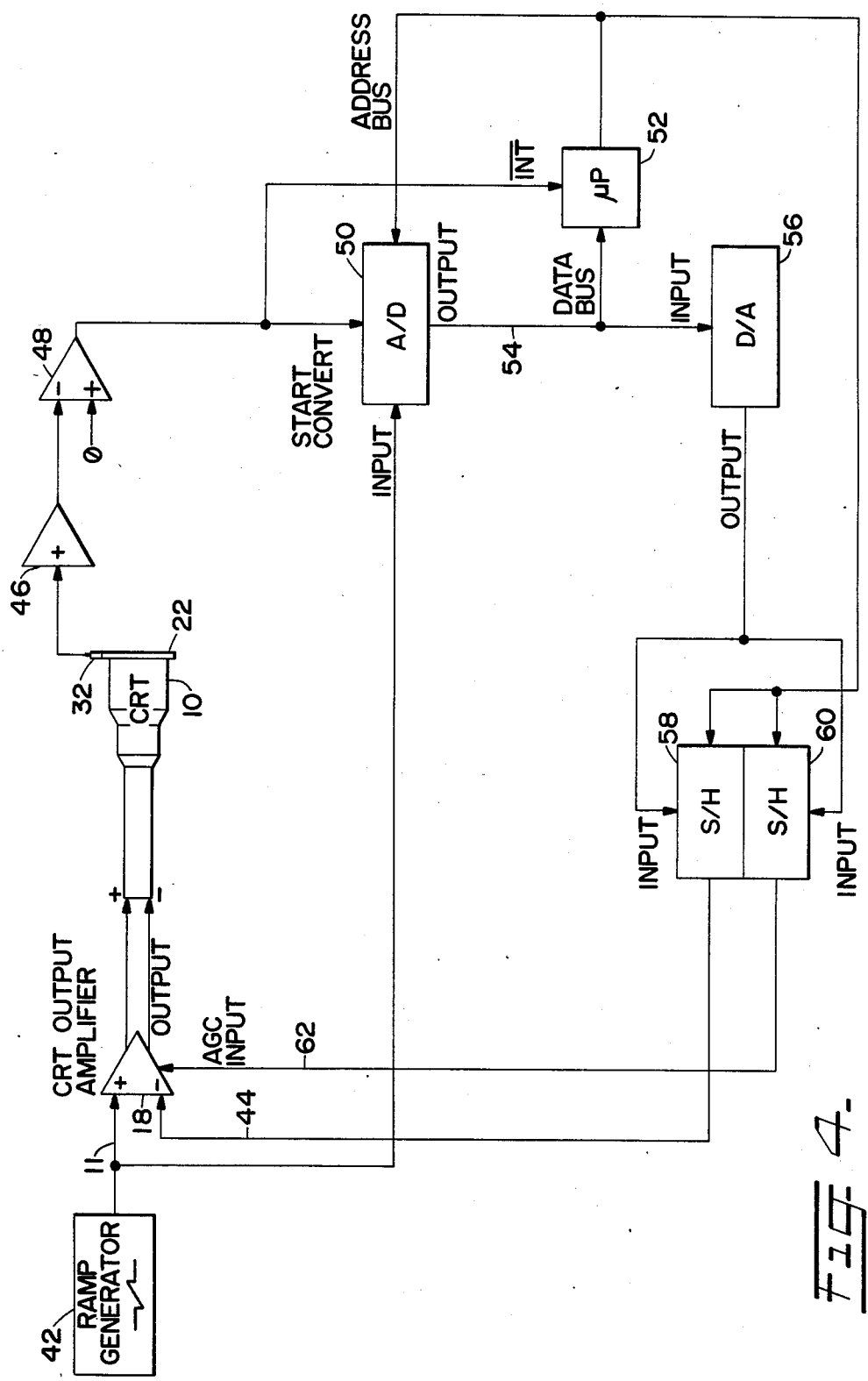

Referring to FIG. 4, illustrating preferred control circuitry, the output of a ramp generator 42 is provided as one input 11 of a cathode-ray-tube deflection amplifier 18, the amplifier also receiving a second or differential input 44. Amplifier 18 drives horizontal deflection plates of cathode-ray-tube 10. Photoelectric detector means 32 disposed at the edge of the faceplate 22 in the hereinbefore described manner supplies an input to signal amplifier 46 having an output connected to voltage comparator 48. An output of voltage comparator 48 occurs if the input thereof exceeds a predetermined level and is utilized for starting analog to digital converter 50 also receiving an input from ramp generator 42. The output from voltage comparator 48 further operates microprocessor 52 so that as the input to voltage comparator 48 exceeds a predetermined level, microprocessor 52 processes the output received from analog to digital converter 50 on data bus 54.

The voltage comparator 48 is utilized for noise rejection and only allows signals to start operation of A to D converter 50 and microprocessor 52 when the output of signal amplifier 46 exceeds a predetermined level. This level should occur as the electron beam, deflected pursuant to the ramp output of ramp generator 42, crosses over one of the graticule lines. Consequently, the converted digital output on data bus 54 will comprise a digitized version of the voltage from ramp generator 42 at the time when an intersection takes place between the horizontal scan and the graticule.

Pursuant to a calculation performed by microprocessor 52, an output is provided to digital to analog converter 56 which supplies an "offset" value to sample and hold circuit 58 and a "gain" value to sample and hold circuit 60. The offset value is connected on lead 44 to the remaining input of differential deflection amplifier 18. The gain value from sample and hold circuit 60 is applied as an AGC input on lead 62 for controlling the gain of amplifier 18.

Figure 5:
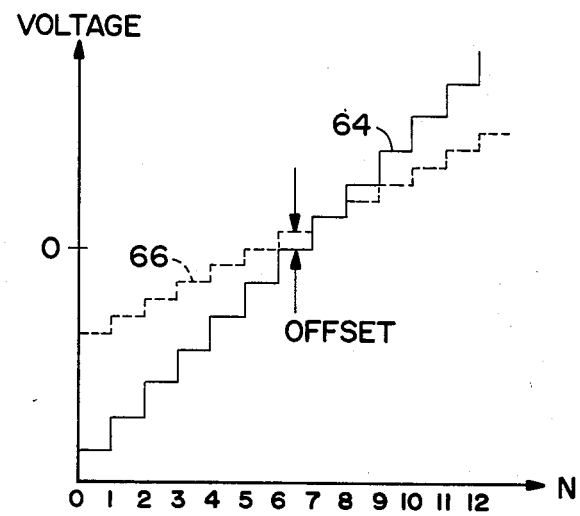
Figure 6:
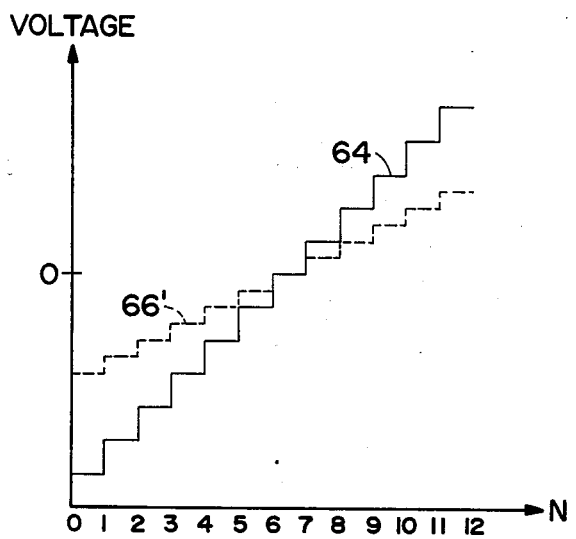
Figure 7:
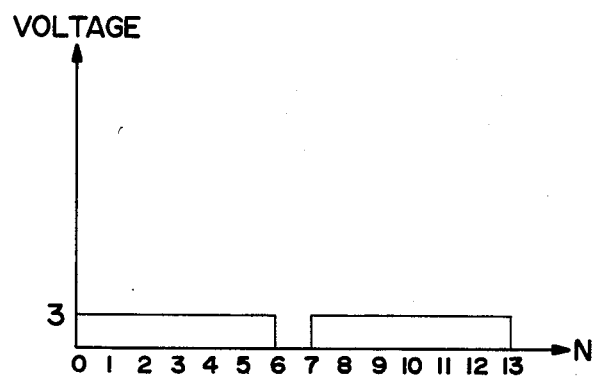

The operation of the circuit of FIG. 4 will be more clearly understood from consideration of the graphs of FIGS. 5, 6 and 7. The microprocessor 52 incorporates memory means which stores a "reference record" 64 indicative of the proper input voltages as would achieve deflection to a given set of graticule lines, e.g. the vertical graticule lines as depicted in FIG. 1. That is, each step of the graph at 64 in FIG. 5 represents a stored digital voltage for a different vertical graticule line, accurately representing what the input at 11 should be when the electron beams intersects that particular graticule line. The "new record" represented at 66 comprises the actual values from ramp generator 42 that are digitized via A to D converter 50 when the cathode-ray-tube's electron beam crosses the respective graticule lines. It is seen from the example in FIG. 5 that not only is there a considerable difference between the two graphs, but also one is centrally offset with respect to the other. Assuming there are ten vertical graticule lines and two borders, the sixth step represents zero deflection or the middle of the screen at which point the reference record and the new record should both indicate a zero voltage ordinate. The "offset" indicates the amount by which the whole new record needs to be shifted in order to place the center step thereof at zero volts.

Returning to FIG. 4, microprocessor 52 ascertains the offset or the difference between the zero volt stored step and the actual digitized input from ramp generator 42 at screen center. The microprocessor, after determining the difference, places the same in sample and hold circuit 58 for subtraction from the input ramp through placing the offset on the lead 44 input to amplifier 18.

FIG. 6 now represents the corrected new record 66' with respect to the reference record 64 wherein the sixth steps are identical. Then, the "reference record" at each step is divided by the "new record" in order to calculate a gain correction. Assuming a linear device, a constant ratio of the reference record to the new record will be derived for each step, except the sixth, and this factor is illustrated by the graph of FIG. 7.

Returning to FIG. 4, the microprocessor 52 further calculates the average for the FIG. 7 steps except the sixth, and enters the reciprocal of the average in sample and hold circuit 60. The output of sample and hold circuit 60 is provided on lead 62 as the automatic gain control input for amplifier 18 whereby the gain of the amplifier is adjusted so that the ramp generator waveform voltage will produce an electron beam deflection for each graticule line corresponding to the predetermined value of that graticule line as stored in the "reference record" memory of microprocessor 52. Assuming each graticule line on either side of center is to represent a fifty millivolt change, and each successive graticule line is to represent a further fifty millivolt change, the gain of amplifier 18 is adjusted so that each fifty millivolt change in the ramp waveform from generator 42 moves the electron beam a distance corresponding to the distance between graticule line intersections.

In some instances, typically encountered because of external illumination of the faceplate, it is of advantage to cover the screen during calibration and/or modulate the Z axis of the cathode-ray-tube, i.e. the intensity of the electron beam, at some frequency such as 20 kHz. A tuned circuit added to signal amplifier 46 is designed to detect the 20 kHz. signal whereby illumination from external sources does not interfere with the operation of the system. It is also of advantage to employ a phosphor in cathode-ray-tube 10 which emits light at a frequency most easily detected by photoelectric means 32.

Although the specific operation of the present system has been described for the most part in terms of horizontal deflection of the electron beam across vertical graticule lines and compensation of the gain of a deflection amplifier to adjust horizontal deflection, it is understood the same correction is made for vertical deflection. Also, the input signal is represented by a ramp signal for convenience of explanation, but need not be a ramp signal in the preferred embodiment.

Figures 8, 9, 10:
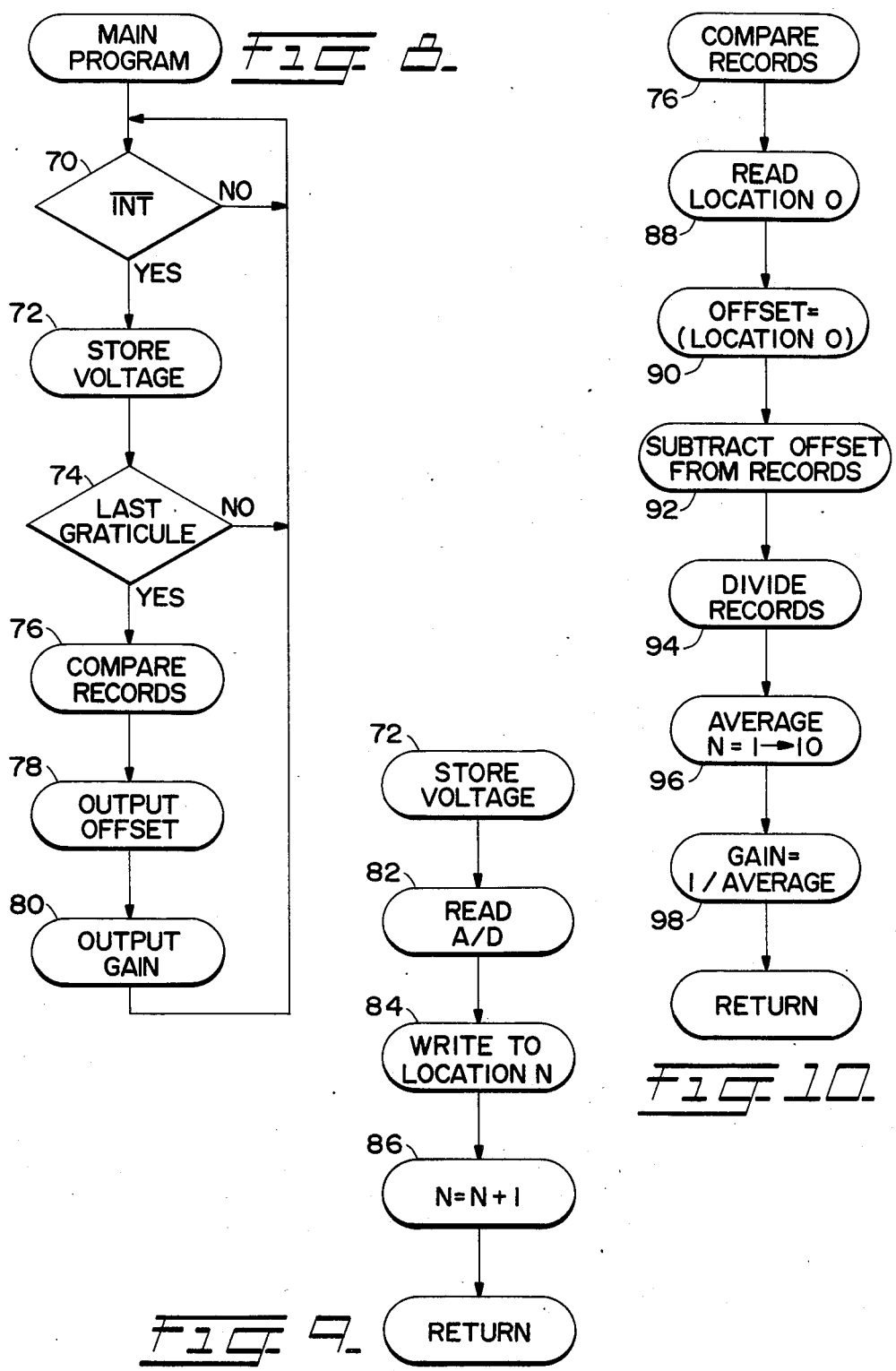

Microprocessor operation is further described in connection with the flow charts of FIGS. 8, 9 and 10. The microprocessor, suitably comprising a Type 8186 manufactured by Intel, is utilized by the oscilloscope for a number of other functions as well as the calibration function. Turning to FIG. 8, decision block 70 determines whether an interrupt signal is received from voltage comparator 48 (FIG. 4) at the microprocessor. If such an interrupt signal is received, the voltage currently converted by A to D converter 50 is stored as indicated at block 72 of the flow chart, this stored voltage corresponding to a step of the "new record" in FIG. 5 or corresponding to the voltage of the input ramp at the time of a graticule line crossing. In block 74 it is determined whether the detection represents the last graticule line of the lines being considered, and if it is not, return is made to block 70. If the last graticule line of the ramp sweep has been received and stored, the reference record and the new record (from FIG. 5) are compared in block 76 with respect to the difference between the two records for the center step. If a difference is detected, an offset is output to sample and hold circuit 58 in accordance with block 78. Also, the comparison in block 76 includes the division of the reference record by the new record at each step and the output of the reciprocal of the average as a gain determining factor for amplifier 18 according to block 80 of the FIG. 8 flow chart.

Referring to FIG. 9, the store voltage subroutine 72 is more fully depicted. A to D converter 50 is read in block 82 and the converted digital value is written to a memory location N in block 84. Then N is made equal to N+1 in block 86 and return is made to block 74 in FIG. 8.

In reference to the flow chart of FIG. 10, the compare records subroutine is more fully described. Location 0, or the voltage for the new record at the sixth step (in FIG. 5), is read in block 88 of the FIG. 10 flow chart, and the prescribed offset is set equal to the location 0 value in block 90. In block 92, the offset value is subtracted from all new record steps to provide the new record as indicated at 66' in FIG. 6. Also, the offset is transmitted to sample and hold circuit 58. In block 94, the reference record is divided by the new record for each step to provide an evaluation as indicated in FIG. 7, after which the steps are averaged in block 96. The prescribed gain is calculated by the microprocessor according to block 98, equaling the reciprocal of the average of the aforementioned divisions. This gain value is transmitted to sample and hold circuit 60 via D to A converter 56. Return is then made to the main program.

The above procedure may be accomplished by the microprocessor at power up of the oscilloscope, and/or at periodic intervals during oscilloscope operation whereby accurate calibration is maintained without down time of the instrument or operator intervention. It will be observed that calibration is accomplished without requiring a specialized cathode-ray-tube, but rather the conventional oscilloscope cathode-ray-tube structure is employed to advantage.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What we claim as our invention is:

1. A method of calibrating deflection in an oscilloscope including a cathode-ray-tube having a faceplate and a light visible graticule mounted on the faceplate, said method comprising the steps of:
   receiving a signal input and deflecting the electron beam of said cathode-ray-tube relative to said graticule in accordance with said signal input,
   photoelectrically detecting light scattered through the faceplate by an intersection of said electron beam with a scale line of said graticule,
   and, in response to said photoelectric detection, automatically adjusting the gain of deflection amplification means of said oscilloscope so that the intersection indicates a deflection which has a predetermined relation to the signal input.

2. A method of calibrating deflection in an oscilloscope including a cathode-ray-tube having a faceplate and a light visible graticule mounted on the faceplate, said method comprising the steps of:
   receiving an input signal and deflecting the electron beam of said cathode-ray-tube relative to said graticule in response to said signal,
   photoelectrically detecting an intersection of said electron beam with a scale line of said graticule by detecting the change in luminescence within the faceplate produced by the phosphor of said cathode-ray-tube when said intersection occurs,
   and, in response to said photoelectric detection, automatically adjusting the deflection of the electron beam of said cathode-ray-tube until said intersection denotes a value corresponding to the value of said signal at the time of said intersection.

3. The method according to claim 2 including comparing the value of said signal at the time of intersection with the value denominated for said graticule and adjusting the deflection of the electron beam by adjusting the gain associated with a deflection amplifier of said oscilloscope until the value of the signal at the time of intersection bears a predetermined relationship with the graticule value.

4. The method according to claim 3 including storing values associated with graticule lines and wherein said comparing is conducted with respect to said stored values.

5. Apparatus for calibrating deflection in an oscilloscope including a cathode-ray-tube, comprising:
a visible graticule associated with the faceplate of said cathode-ray-tube,
means for receiving an input,
means for deflecting the electron beam of said cathode-ray-tube across said graticule in response to said input,
photoelectric means for detecting light scattered by an intersection of said electron beam with scale lines of said graticule, the photoelectric means detecting the change in light emission scattered through the faceplate from the phosphor screen of said cathode-ray-tube when the intersection occurs,
and means for automatically adjusting the deflection of said electron beam until said intersection with said graticule has a predetermined relation with said input at the time of intersection.

6. The apparatus according to claim 5 wherein said means for automatically adjusting includes means for comparing the value of said input at the time of said intersection with a value as specified by a graticule line, and means for adjusting the gain of deflection amplification means of said oscilloscope until said intersection has said predetermined relation with said input.

7. The apparatus according to claim 5 wherein said photoelectric means comprises a photoelectric detector positioned at an edge of the faceplate of said cathode-ray-tube.

8. The apparatus according to claim 7 wherein said graticule comprises a glass frit configuration on the interior side of said faceplate having a phosphor layer thereover and wherein said photoelectric detector detects scattered light as said electron beam passes across said graticule.

* * * * *